(12) United States Patent
Siau et al.

(10) Patent No.: US 12,079,479 B2
(45) Date of Patent: Sep. 3, 2024

(54) MEMORY DEVICE WITH MULTIPLE INPUT/OUTPUT INTERFACES

(71) Applicant: Micron Technology, Inc., Boise, ID (US)

(72) Inventors: Chang H. Siau, Saratoga, CA (US); Jonathan S. Parry, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 55 days.

(21) Appl. No.: 17/672,026

(22) Filed: Feb. 15, 2022

(65) Prior Publication Data

US 2023/0068580 A1 Mar. 2, 2023

Related U.S. Application Data

(60) Provisional application No. 63/237,924, filed on Aug. 27, 2021.

(51) Int. Cl.
*G06F 3/06* (2006.01)

(52) U.S. Cl.
CPC .......... *G06F 3/0611* (2013.01); *G06F 3/0604* (2013.01); *G06F 3/0659* (2013.01); *G06F 3/0679* (2013.01)

(58) Field of Classification Search
None
See application file for complete search history.

(56) References Cited

U.S. PATENT DOCUMENTS

| | | | |
|---|---|---|---|
| 2012/0221921 A1* | 8/2012 | Masuo | G06F 11/141 711/E12.001 |
| 2013/0138868 A1* | 5/2013 | Seroff | G06F 13/1684 711/E12.008 |
| 2015/0006814 A1* | 1/2015 | Phong | G06F 3/0689 711/114 |
| 2018/0254079 A1* | 9/2018 | Cox | G11C 29/52 |
| 2019/0370193 A1* | 12/2019 | Rowley | G06F 3/0658 |
| 2020/0043530 A1* | 2/2020 | Shibata | H01L 27/0688 |
| 2020/0401512 A1* | 12/2020 | Duran | G06F 3/0619 |
| 2021/0240566 A1* | 8/2021 | Kedia | G06F 13/4027 |
| 2022/0050632 A1* | 2/2022 | Hong | G06F 13/102 |

* cited by examiner

*Primary Examiner* — Stephanie Wu
(74) *Attorney, Agent, or Firm* — Lowenstein Sandler LLP

(57) ABSTRACT

A memory device including a first plane group comprising a first plane, a second plane group comprising a second plane, a first input/output (I/O) interface configured to access the first plane group, and a second I/O interface configured to access the second plane group. The memory device further includes a controller operatively coupled to the first I/O interface via a first channel and operatively coupled to the second I/O interface via a second channel. The controller can transmit, via the first channel to the first I/O interface, a first command to execute a first memory access operation associated with the first plane. The controller can transmit, via the second channel to the second I/O interface, a second command to execute a second memory access operation associated with the second plane.

19 Claims, 8 Drawing Sheets

MEMORY DEVICE WITH MULTIPLE INPUT/OUTPUT INTERFACES

CROSS-REFERENCE TO RELATED APPLICATION

This application claims the benefit of U.S. Provisional Application No. 63/237,924, titled "Memory Device with Multiple Input/Output Interfaces," filed Aug. 27, 2021, the entire disclosure of which is incorporated herein by reference.

TECHNICAL FIELD

Embodiments of the disclosure relate generally to memory sub-systems, and more specifically, relate to a memory device with multiple input/output interfaces.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
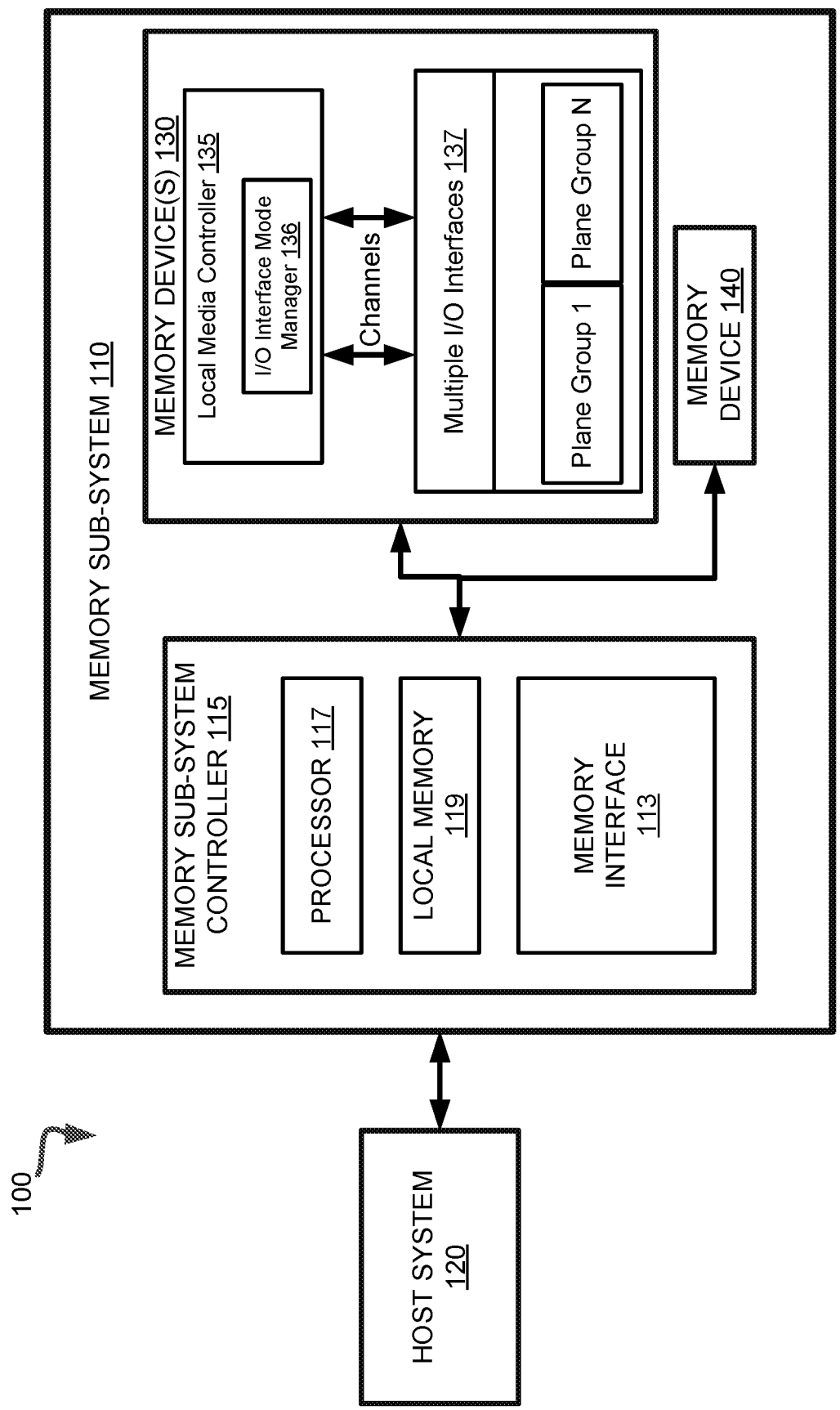
FIG. 1 illustrates an example computing system that includes a memory sub-system, in accordance with some embodiments of the present disclosure.

Aspects of the present disclosure are directed to a memory sub-system including a memory device with multiple input/output interfaces. A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a negative-and (NAND) memory device. Other examples of non-volatile memory devices are described below in conjunction with FIG. 1. A non-volatile memory device is a package of one or more memory dies. Each memory die can consist of one or more planes. For some types of non-volatile memory devices (e.g., NAND devices), each plane consists of a set of physical blocks. Each block consists of a set of pages. Each page consists of a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values.

A host system may initiate a memory access operation (e.g., a program operation, read operation, erase operation) associated with the memory array of the one or more memory dies of the memory device. The memory device includes a serial input/output (I/O) interface including a series of I/O pads operatively coupled to a local media controller by one or more communication channels (e.g., one or more Open NAND Flash Interface Working Group (ONFI) channels). The pads are used to provide a serial high-frequency input data stream for transmission of data via an input data bus to the memory array.

Each channel (e.g., 8-bit channel, 16-bit channel) transmits the commands and data (e.g., including an address to identify a target memory plane of the memory device) associated with the underlying memory access operations to the I/O interface associated with a target memory device. In certain systems, each memory device communicates with the controller via a single I/O interface (i.e., each memory device has its own I/O interface for communication with the controller) and single channel (e.g., a single channel runs between the controller with the respective I/O interface of each memory device).

The I/O interface of the memory device includes a set of I/O pins configured to process communications between the local media controller and the memory plane groups of one or more memory die of the memory sub-system. In certain arrangements, each memory die communicates with the local media controller via the I/O pins of the respective I/O interface (e.g., each memory die has its own I/O interface). For example, for a memory sub-system including a single memory device (e.g., a single memory die), all of the planes (e.g., a set of 8 planes) of the memory die are accessed by a single I/O interface via a single communication channel. The various pins of the I/O interface are wire-bonded to the multiple planes of the memory die to enable the transmission of the commands and data between the respective planes of the memory die and the local media controller relating to the execution of memory access operations (e.g., read operations, write operations, erase operations, etc.). Due to the physical arrangement of the single set of I/O pins, the wire bonds between the pins and the stacked multiple planes of the memory die are interleaved in view of the limited availability of physical space.

Memory sub-systems can be configured as low-density systems (e.g., with one memory die) or high-density systems (e.g., with multiple memory dies) which are configured to handle a variety of different loads having different bandwidth requirements. For example, a typical low-density memory sub-system may include a single memory die communicatively coupled to the local media controller via a single channel and single I/O interface (e.g., single set of I/O pins). In this type of single I/O interface system, in order to increase the bandwidth, the transmission speed is increased (e.g., a 2× transmission speed is employed). However, the use of higher transmission rates requires the use of high-speed I/O circuits in the I/O interface, which can increase the cost of the memory device.

In other instances, a wider channel is employed to increase the bandwidth of the communication between the local media controller and the memory die. For example, a 16-bit channel or two 8-bit channels bonded together can be used to increase the bandwidth. However, this requires the increasing of the channel size or the additional bonding of multiple channels.

Furthermore, a typical memory sub-system includes other command pins (e.g., a chip enable (CE) pin, a write protect (WP) pin, a ready-busy (RB) pin, etc.) that are configured at the memory die-level. Accordingly, these memory-die level command pins are provided along with each I/O interface to enable communications on a per-channel basis between the controller and each respective memory die. For some typical high-density systems, this can lead to the placement of a large number of pins that consume physical space within the memory sub-system.

Aspects of the present disclosure address the above and other deficiencies by implementing a memory device including multiple I/O interfaces. In one embodiment, the multiple I/O interfaces, including for example a first I/O interface and a second I/O interface, are provided to enable communications between memory planes (e.g., memory plane 1 through memory plane N) and a local media controller. The memory sub-system includes respective channels associated with the multiple I/O interfaces, such as a first channel between the local media controller and the first I/O interface and a second channel between the local media controller and the second I/O interface. In an embodiment, the memory device (e.g., memory die) can include multiple plane groups that each include a group or set of planes of the memory device. For example, an 8-plane memory device can include a first plane group including plane 0, plane 1, plane 2, and plane 3 and a second plane group including plane 4, plane 5, plane 6, and plane 7.

In an embodiment, the memory device including the multiple I/O interfaces (also referred to as a multi-interface memory device) can be operated in a multi-channel mode (e.g., also referred to as a "two-channel mode" or a "first mode") where each of the channels (e.g., the first channel and the second channel) are activated or enabled. In an embodiment, during operation in the two-channel mode, a first channel (Channel 1) is configured to access a first plane group of the memory device (e.g., plane 0, plane 1, plane 2, and plane 3 of an 8-plane memory device having two plane groups) and a second channel (Channel 2) is configured to access a second plane group of the memory device (e.g., plane 4, plane 5, plane 6, and plane 7 of the 8-plane memory device). Advantageously, multiple channels (e.g., Channel 1 and Channel 2) can be run to the same memory device since the memory device includes multiple I/O interfaces, resulting in increased bandwidth, without having to increase the transmission rate. In this regard, the two plane groups can operate independent from one another, such that memory access operations (e.g., read, program, erase operations) can be processing concurrently with respect to planes of the independent plane groups. In an embodiment, the multi-channel mode can be used in low-density systems having a single memory device that benefits from having multiple channels and multiple I/O interfaces.

In an embodiment, the memory device can be operated in a single-channel mode (also referred to as a "second mode") where one channel is activated and the one or more other channels are deactivated or disabled). In this embodiment, during operation in the one-channel mode, the activated channel is configured to process communications between the controller and all of the plane groups of the memory device (e.g., a first plane group and a second plane group of the multi-plane memory device). In this embodiment, cross-plane group access is enabled such that the activated I/O interface accesses the multiple plane groups.

In an embodiment, with one or more I/O interfaces disabled, the multiple plane groups are accessible via the single I/O interface that is activated. For example, the single-channel mode can be used in a high density system including a memory sub-system with multiple memory device (e.g., a stacked arrangement of multiple memory dies (e.g., 8 memory dies, 16 memory dies per memory device)) to optimize the bandwidth of the system without the need for an I/O expander or additional intermediate buffers.

Advantageously, as compared to the typical single I/O interface configurations, the multiple I/O interfaces of the memory device according to the present disclosure enables the increase in bandwidth and configurable operation for both low-density and high-density memory devices. In this regard, the multi-interface memory device of the present disclosure can be used to service high bandwidth systems (e.g., 256 GB to 2 TB) with a single memory die. In addition, the multi-interface memory device can be expanded to include any number of channels and I/O interfaces (e.g., a memory device having four channels, eight channels, etc.). An additional benefit is achieved by having a memory device with the multiple I/O interfaces arranged in a side-by-side configuration to enable one plane group to be wire bonded to a first I/O interface and a second plane group to be wire bonded to the adjacent second I/O interface, thereby avoiding the need to interleave the wire bonds between a single interface and all of the plane groups. Furthermore, in an embodiment, command pin reduction can be achieved by establishing one or more common command pins (e.g., the CE pin, WP pin, RB pin, etc.) that are shared by the multiple I/O interfaces and associated memory dies.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., one or more memory device(s) 130), or a combination of such. The memory sub-system 110 can be a storage device, a memory module, or a hybrid of a storage device and memory module.

The memory device(s) 130 can be non-volatile memory device(s). One example of non-volatile memory devices is a negative-and (NAND) memory device. A non-volatile memory device is a package of one or more dice or logic units (LUNs). Thus, each memory device 130 can be a die (or LUN) or can be a multi-dice package that includes multiple dice (or LUNs) on a chip, e.g., an integrated circuit package of dice. Each memory die can include one or more planes. For some types of non-volatile memory devices (e.g., NAND devices), each plane includes a set of physical blocks. Each block includes a set of pages. Each page includes a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., the one or more memory device(s) 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device(s) 130) include negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory device(s) 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory device(s) 130 can include one or more arrays of memory cells such as SLCs, MLCs, TLCs, QLCs, or any combination of such. In some embodiments, a particular memory device can include an SLC portion, and an MLC portion, a TLC portion, a QLC portion, or a PLC portion of memory cells. The memory cells of the memory device(s) 130 can be grouped as pages that can refer to a logical unit of the memory device used to store data. With some types of memory (e.g., NAND), pages can be grouped to form blocks.

Although non-volatile memory components such as 3D cross-point array of non-volatile memory cells and NAND type flash memory (e.g., 2D NAND, 3D NAND) are described, the memory device(s) 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory device(s) 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can be a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory device(s) 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory device(s) 130. The memory sub-system controller 115 can further include host interface circuitry to communicate with the host system 120 via the physical host interface. The host interface circuitry can convert the commands received from the host system into command instructions to access the memory device(s) 130 as well as convert responses associated with the memory device(s) 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory device(s) 130.

In some embodiments, the memory device(s) 130 include local media controllers 135 that operate in conjunction with memory sub-system controller 115 to execute operations on one or more memory cells of the memory device(s) 130. An external controller (e.g., memory sub-system controller 115) can externally manage the memory device 130 (e.g., perform media management operations on the memory device(s) 130). In some embodiments, memory sub-system 110 is a managed memory device, which includes a raw memory device having control logic (e.g., local media controller 135) on the memory die and a controller (e.g., memory sub-system controller 115) for media management within the same memory device package. An example of a managed memory device is a managed NAND (MNAND) device.

In one embodiment, the memory sub-system 110 includes a memory interface component 113. Memory interface component 113 is responsible for handling interactions of memory sub-system controller 115 with the memory devices of memory sub-system 110, such as memory device 130. For example, memory interface component 113 can send memory access commands corresponding to requests received from host system 120 to memory device(s) 130, such as program commands, read commands, or other commands. In addition, memory interface component 113 can receive data from memory device(s) 130, such as data retrieved in response to a read command or a confirmation that a program command was successfully performed. For example, the memory sub-system controller 115 can include a processor 117 (processing device) configured to execute instructions stored in local memory 119 for performing the operations described herein.

In an embodiment, each memory device 130 (e.g., a memory die) includes multiple channels and I/O interfaces 137 configured to transmit communications between the local media controller 135 and a memory array. In an embodiment, the multiple I/O interfaces 137 includes a first I/O interface configured to access plane group 1 of the memory device(s) 130 and a second I/O interface configured to access plane group 2 of the memory device(s) 130. As illustrated in FIG. 1, multiple channels provide a communication path running between the memory device(s) 130 and the controller.

In an embodiment, the local media controller 135 includes an I/O interface mode manager 136 configured to manage the modes associated with the multiple I/O interfaces 137. In an embodiment, the I/O interface mode manager 136 can configure the memory device(s) 130 to operate in a multi-channel mode (i.e., a two-channel mode or first mode) or in a single-channel mode (i.e., a second mode). In the multi-channel mode, the multiple channels and corresponding I/O interfaces are activated. In an example including two channels and two I/O interfaces, a first I/O interface is configured to access Plane Group 1 (e.g., planes 0, 1, 2, and 3 of an 8-plane memory die) and a second I/O interface is configured to access Plane Group 2 (e.g., planes 4, 5, 6, and 7 of the 8-plane memory die).

In an embodiment, the I/O interface mode manager 136 can configure the memory device(s) 130 to operate in the single-channel (or second mode), where a first I/O interface of the multiple I/O interfaces 137 is activated and one or more other I/O interfaces of the multiple I/O interfaces 137 are disabled. In this embodiment, the activated I/O interface and associated channel are used to transmit communications to the multiple plane groups of the memory device(s) 130. For example, in this embodiment, an activated first I/O interface of the multiple I/O interfaces 137 accesses plane group 1 through plane group N (e.g., where N=2 for an example memory device having two plane groups, each including four planes of an 8-plane memory die). Aspects of the I/O interface mode manager 136, the multiple I/O interfaces 137, the multiple channels and the multiple configurable modes (e.g., the two-channel mode and the single-channel mode) are described in greater detail below with respect to FIGS. 3-7.

Figure 2:
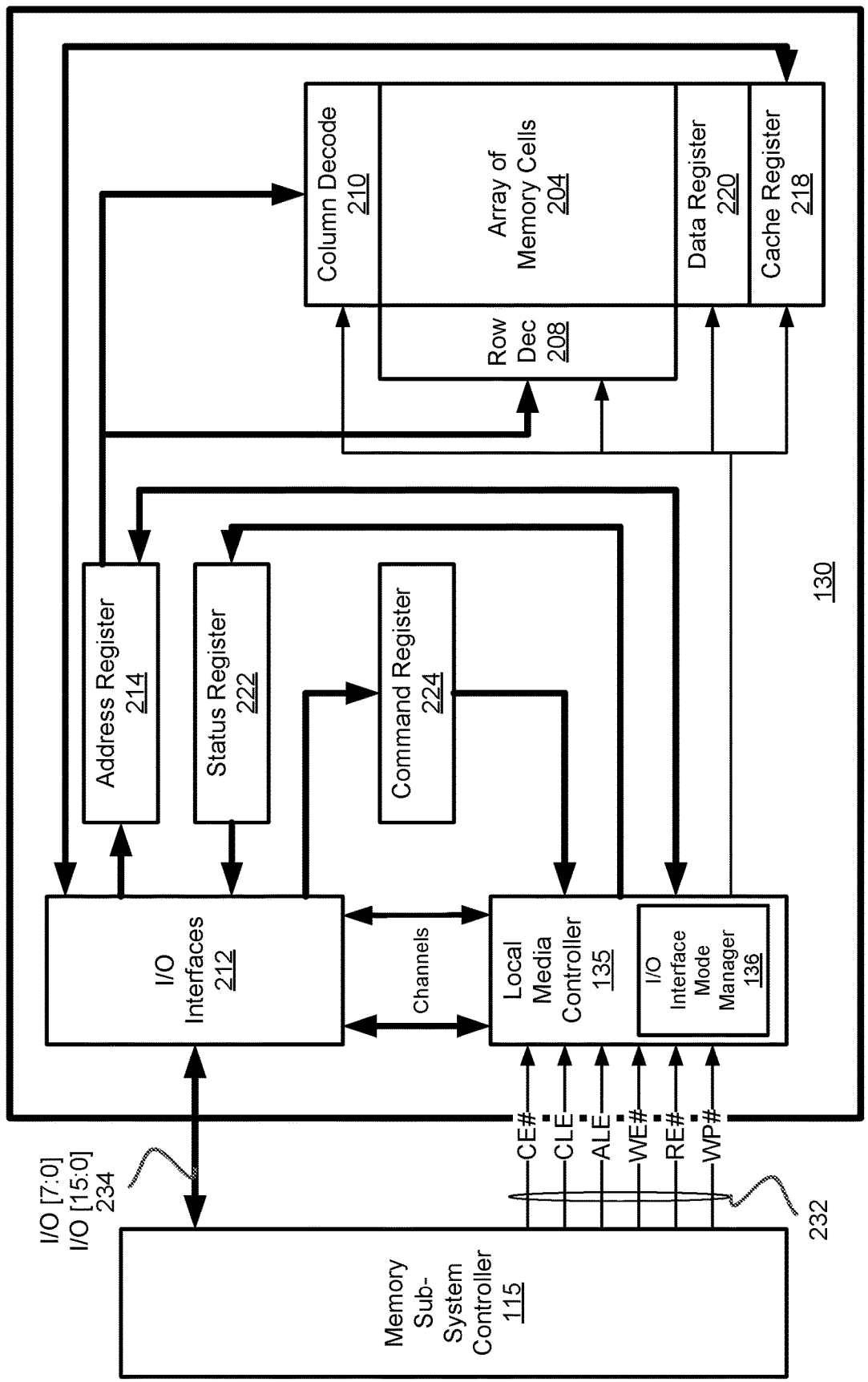
FIG. 2 is a block diagram of memory device(s) in communication with a memory sub-system controller of a memory sub-system, in accordance with some embodiments of the present disclosure.

FIG. 2 is a simplified block diagram of a first apparatus, in the form of the one or more memory device(s) 130, in communication with a second apparatus, in the form of a memory sub-system controller 115 of a memory sub-system (e.g., memory sub-system 110 of FIG. 1), according to an embodiment. Some examples of electronic systems include personal computers, personal digital assistants (PDAs), digital cameras, digital media players, digital recorders, games, appliances, vehicles, wireless devices, mobile telephones and the like. The memory sub-system controller 115 (e.g., a controller external to the memory device 130), may be a memory controller or other external host device. According to embodiments, the memory sub-system 110 can have multiple memory devices 130 (e.g., multiple memory die), where each memory devices 130 includes memory plane groups 1-N.

Each memory device 130 includes an array of memory cells 204 logically arranged in rows and columns. Memory cells of a logical row are typically connected to the same access line (e.g., a wordline) while memory cells of a logical column are typically selectively connected to the same data line (e.g., a bit line). A single access line may be associated with more than one logical row of memory cells and a single data line may be associated with more than one logical column. Memory cells (not shown in FIG. 2) of at least a portion of array of memory cells 204 are capable of being programmed to one of at least two target data states.

Row decode circuitry 208 and column decode circuitry 210 are provided to decode address signals. Address signals are received and decoded to access the array of memory cells 204. Each memory device 130 also includes input/output (I/O) control circuitry 212 to manage input of commands, addresses and data to each memory device 130 as well as output of data and status information from each memory device 130. According to embodiments, the I/O control interfaces 212 includes multiple I/O interfaces to manage communications between the local media controller 135 and a respective memory die including an array of memory cells 204. An address register 214 is in communication with I/O control circuitry 212 and row decode circuitry 208 and column decode circuitry 210 to latch the address signals prior to decoding. A command register 224 is in communication with multiple I/O interfaces 212 and local media controller 135 to latch incoming commands.

A controller (e.g., the local media controller 135 internal to each memory device 130) controls access to the array of memory cells 204 in response to the commands and generates status information for the external memory sub-system controller 115, i.e., the local media controller 135 is configured to perform access operations (e.g., read operations, programming operations and/or erase operations) on the array of memory cells 204. The local media controller 135 is in communication with row decode circuitry 208 and column decode circuitry 210 to control the row decode circuitry 208 and column decode circuitry 210 in response to the addresses. In one embodiment, local media controller 135 includes instructions which can be executed in connection with the operations and functions of the I/O interface mode manager 136 and I/O interfaces 212 of memory device 130, as described herein.

The local media controller 135 is in communication with the multiple I/O interfaces 212 via respective channels (e.g., each I/O interface is associated with a channel providing a communication path with the local media controller 135) in accordance with embodiments of the present disclosure. In an embodiment, the local media controller 135 includes an I/O interface mode manager 136 to manage the operational mode of each memory device 130. In an embodiment, the I/O interface mode manager 136 can configure (e.g., through the use of commands) the memory device 130 to operate in the multi-channel mode (e.g., a two-channel mode for a memory device having two I/O interfaces each having a respective channel) or a single-channel mode. In an example, in the two-channel mode, a first I/O interface and a second I/O interface of the I/O interfaces 212 are activated. In an embodiment, the first I/O interface is activated to access a first plane group of the memory die and the second I/O interface is activated to access a second plane group of the memory die.

In an embodiment, in the single-channel mode, one of the I/O interfaces (e.g., the first I/O interface) of the I/O interfaces 212 to is activated and the remaining one or more I/O interfaces are disabled (e.g., the second I/O interface in a two-channel configuration). In an embodiment, in the single-channel mode, each memory die of the memory device 130 communicates with the local media controller 135 via a single channel and the single activated I/O interface. For example, as described in greater detail below with reference to FIG. 6, for a memory sub-system including two memory dies (e.g., a first memory die and a second memory die), in the single-channel mode, all plane groups (e.g., plane group 1 and plane group 2) of the first memory die are accessed by I/O interface 1 (i.e., the activated or enabled I/O interface) and a first channel. In this example, all plane groups (e.g., plane group 1 and plane group 2) of a second memory die are access by I/O interface 1 (i.e., the activated or enabled I/O interface) and a second channel.

The local media controller 135 is also in communication with a cache register 218. Cache register 218 latches data, either incoming or outgoing, as directed by the local media controller 135 to temporarily store data while the array of memory cells 204 is busy writing or reading, respectively, other data. During a program operation (e.g., write operation), data may be passed from the cache register 218 to the data register 220 for transfer to the array of memory cells 204; then new data may be latched in the cache register 218 from the I/O control circuitry 212. During a read operation, data may be passed from the cache register 218 to the I/O control circuitry 212 for output to the memory sub-system controller 115; then new data may be passed from the data register 220 to the cache register 218. The cache register 218 and/or the data register 220 may form (e.g., may form a portion of) a page buffer of the memory device 130. A page buffer may further include sensing devices (not shown in FIG. 2) to sense a data state of a memory cell of the array of memory cells 204, e.g., by sensing a state of a data line connected to that memory cell. A status register 222 may be in communication with I/O control circuitry 212 and the local memory controller 135 to latch the status information for output to the memory sub-system controller 115.

Each memory device 130 receives control signals at the memory sub-system controller 115 from the local media controller 135 over a control link 232. For example, the control signals can include a chip enable signal CE #, a command latch enable signal CLE, an address latch enable signal ALE, a write enable signal WE #, a read enable signal RE #, and a write protect signal WP #. Additional or alternative control signals (not shown) may be further received over control link 232 depending upon the nature of each memory device 130. In one embodiment, each memory device 130 receives command signals (which represent commands), address signals (which represent addresses), and data signals (which represent data) from the memory sub-system controller 115 over a multiplexed input/output (I/O) bus 234 and outputs data to the memory sub-system controller 115 over I/O bus 234.

For example, the commands may be received over input/output (I/O) pins [7:0] of I/O bus 234 at I/O control circuitry 212 and may then be written into command register 224. The addresses may be received over input/output (I/O) pins [7:0] of I/O bus 234 at I/O control circuitry 212 and may then be written into address register 214. The data may be received over input/output (I/O) pins [7:0] for an 8-bit device or input/output (I/O) pins [15:0] for a 16-bit device at one or more of the I/O control interfaces 212 and then may be written into cache register 218. The data may be subsequently written into data register 220 for programming the array of memory cells 204.

In an embodiment, cache register 218 may be omitted, and the data may be written directly into data register 220. Data may also be output over input/output (I/O) pins [7:0] for an 8-bit device or input/output (I/O) pins [15:0] for a 16-bit device. Although reference may be made to I/O pins, they may include any conductive node providing for electrical connection to the memory device 130 by an external device (e.g., the memory sub-system controller 115), such as conductive pads or conductive bumps as are commonly used.

It will be appreciated by those skilled in the art that additional circuitry and signals can be provided, and that each memory device 130 of FIG. 2 has been simplified. It should be recognized that the functionality of the various block components described with reference to FIG. 2 may not necessarily be segregated to distinct components or component portions of an integrated circuit device. For example, a single component or component portion of an integrated circuit device could be adapted to perform the functionality of more than one block component of FIG. 2. Alternatively, one or more components or component portions of an integrated circuit device could be combined to perform the functionality of a single block component of FIG. 2. Additionally, while specific I/O pins are described in accordance with popular conventions for receipt and output of the various signals, it is noted that other combinations or numbers of I/O pins (or other I/O node structures) may be used in the various embodiments.

Figure 3:
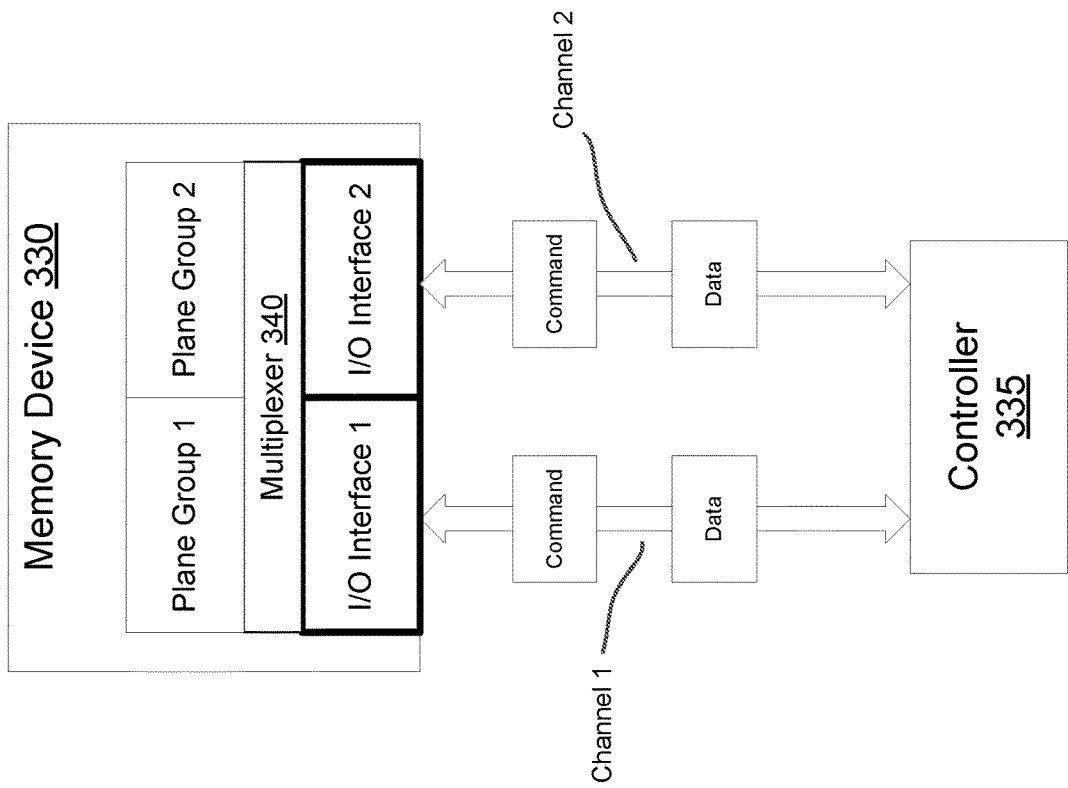
FIG. 3 is a schematic illustration of an example the memory device(s) including one or memory die having multiple input/output (I/O) interfaces configured to access multiple plane groups of the memory device(s), in accordance with embodiments of the present disclosure.

FIG. 3 is a schematic illustration of an example memory sub-system having with a memory device 330 having multiple plane groups (e.g., plane group 1 and plane group 2) accessible by multiple I/O interfaces (e.g., I/O interface 1 and I/O interface 2). In an embodiment, the controller 335 can configure the memory device to operate in a first mode where both I/O interface 1 and I/O interface 2 are activated or enabled. In this embodiment, commands and data are transmitted via channel 1 to I/O interface 1 and commands and data are transmitted via channel 1 to I/O interface 2.

In an embodiment, I/O interface 1 operating in the first mode (i.e., the two-channel mode) is configured to access plane group 1 (e.g., planes 0, 1, 2, and 3 of an 8-plane memory die) and I/O interface 2 is configured to access plane group 2 (e.g., planes 4, 5, 6, and 7 of the 8-plane memory die). In an embodiment, default associations for each I/O interface can be maintained (e.g., the default configuration can indicate that I/O interface 1 accesses plane group 1 and I/O interface 2 accesses plane group 2), as described in greater detail below with reference to FIG. 4. Advantageously, the multiple I/O interfaces (e.g., I/O interface 1 and I/O interface 2) enables multiple channels (e.g., channel 1 and channel 2) to be run to a single memory device 330 (e.g., a single memory die). This results in an increase in bandwidth, without increasing the size of the channels (e.g., channel 1 and channel 2 can be 8-bit ONFI channels) and without increasing the transmission speed of the communications transmitted via the channels.

In an embodiment, the respective I/O interfaces (e.g., I/O interface 1 and I/O interface 2) can access all of the plane groups. For example, both I/O interface 1 and 2 can be configured to access both plane group 1 and plane group 2. In this regard, in an embodiment, the two I/O interfaces can be configured to access multiple planes in the same plane group concurrently (e.g., I/O interface 1 can access plane 0 of plane group 1 and I/O interface 2 can access plane 3 of plane group 1 concurrently). Advantageously, enabling the two I/O interfaces to access the same plane group concurrently improves the random read performance of the memory device.

In an embodiment, the controller 335 can include logic to determine which channel or I/O interface to use when sending a communication to the memory die. For example, the controller 335 can have a first command to read plane 2 of plane group 1. In this example, the controller 335 determines that I/O interface 1 is configured as the default interface for accessing plane group 1 when operating in the two-channel mode. In this example, the controller 335 may determine that I/O interface 1 is busy (e.g., there is an on-going write command being executed on plane 0 of plane group 1 using I/O interface 1). In response to this determination, the controller 335 can transmit a command to I/O interface 2 via channel 2 to execute the read command with respect to plane 2.

In an embodiment, the memory device 330 can include a multiplexer circuit (i.e., a MUX) configured to enable the multiple I/O interfaces to selectively access planes in the multiple plane groups, as described in greater detail below with reference to FIG. 5. In this embodiment, the multiplexer can be used to enable access to a target plane in either plane group by either of the I/O interfaces and channels. In an embodiment, the multiplexer allows the communications to go from each I/O interface to one or more of the plane groups.

In an embodiment, the memory device 330 can be configured in either of the first mode (e.g., the multi-channel mode) or the second mode (e.g., the single-channel mode). In an embodiment, the controller 335 can dynamically change from one mode to another mode in response to the detection of a condition or factor. For example, in response to detection of operation of the memory device in low-power mode, the controller 335 can switch from the multi-channel mode to a single-channel mode.

In an embodiment, a further advantage can be achieved by including common pins (e.g., die-level command pins such as a CE pin, a WP pin, an RB pin, etc.) can be shared by the multiple I/O interfaces. In this embodiment, the total number of pins can be reduced in view of the use of the common pins by the multiple I/O interfaces, thereby resulting in a space savings within the memory device.

In an embodiment, as shown schematically in FIG. 3, the multiple I/O interfaces can be physically arranged in a side-by-side manner. In the side-by-side arrangement, the various pins of the I/O set can be wire-bonded to the respective planes of the one or more memory dies, without having to interleave the wire bonds. Advantageously, the avoidance of interleaved wire bonding reduces the complexity in the production of the memory device and further results in a savings of physical space.

Figure 4:
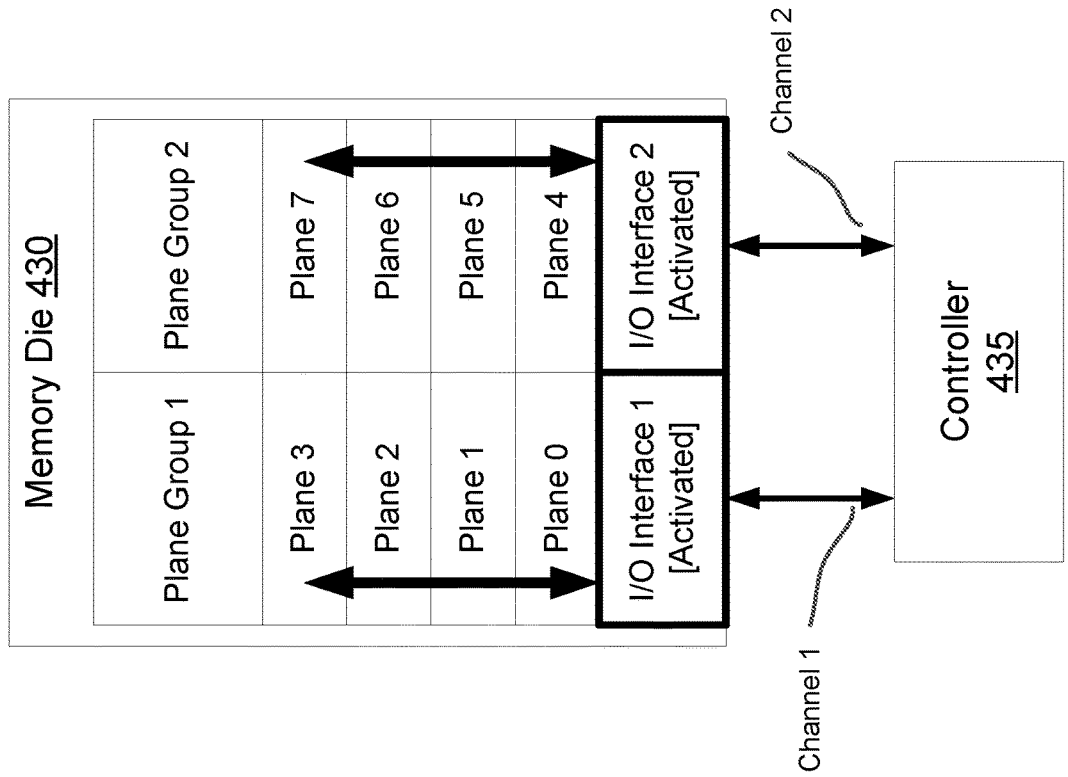
FIG. 4 is a schematic illustration of an example memory device including multiple I/O interfaces operating in a multi-channel mode, in accordance with embodiments of the present disclosure.

FIG. 4 illustrates an embodiment where a low-density memory sub-system including a single memory device 430 (e.g., a single memory die) is configured to operate in the two-channel mode. In this example, the single 8-plane memory device includes two plane groups: plane group 1 including planes 0, 1, 2, and 3; and plane group 2 including planes 4, 5, 6, and 7. As shown, in this example, I/O interface 1 and I/O interface 2 are activated. In an embodiment, the I/O interfaces can be activated (or deactivated) by way of a command from the controller 435. In an embodiment, an I/O interface can be activated or deactivated by a trim command or via bonding.

In the example shown, I/O interface 1 is configured to access plane group 1 and I/O interface 2 is configured to access plane group 2. As illustrated, the single memory device is accessible via multiple channels (e.g., channel 1 and channel 2) using the multiple I/O interfaces (e.g., I/O interface 1 and I/O interface 2).

Figure 5:
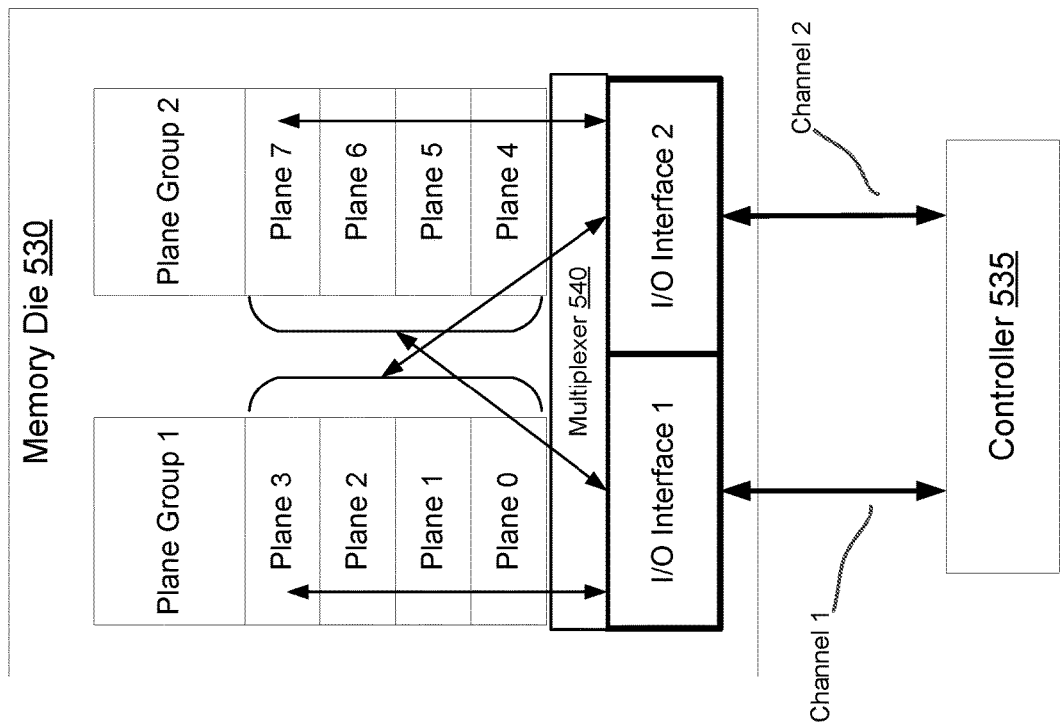
FIG. 5 is a schematic illustration of an example memory device including a multiplexer circuit and multiple I/O interfaces operating in a multi-channel mode, in accordance with embodiments of the present disclosure.

FIG. 5 illustrates a memory die 538 including a multiplexer circuit 540 to enable each of the I/O interfaces to access planes in the multiple plane groups. As illustrated, the multiplexer 540 of the memory die 530 (e.g., memory die) enables I/O interface 1, when activated, to access the planes of plane group 1 and the planes of plane group 2. Similarly, the multiplexer can be used to enable I/O interface 2 to access the planes of plane group 1 and the planes of plane group 2, when activated.

Figure 6:
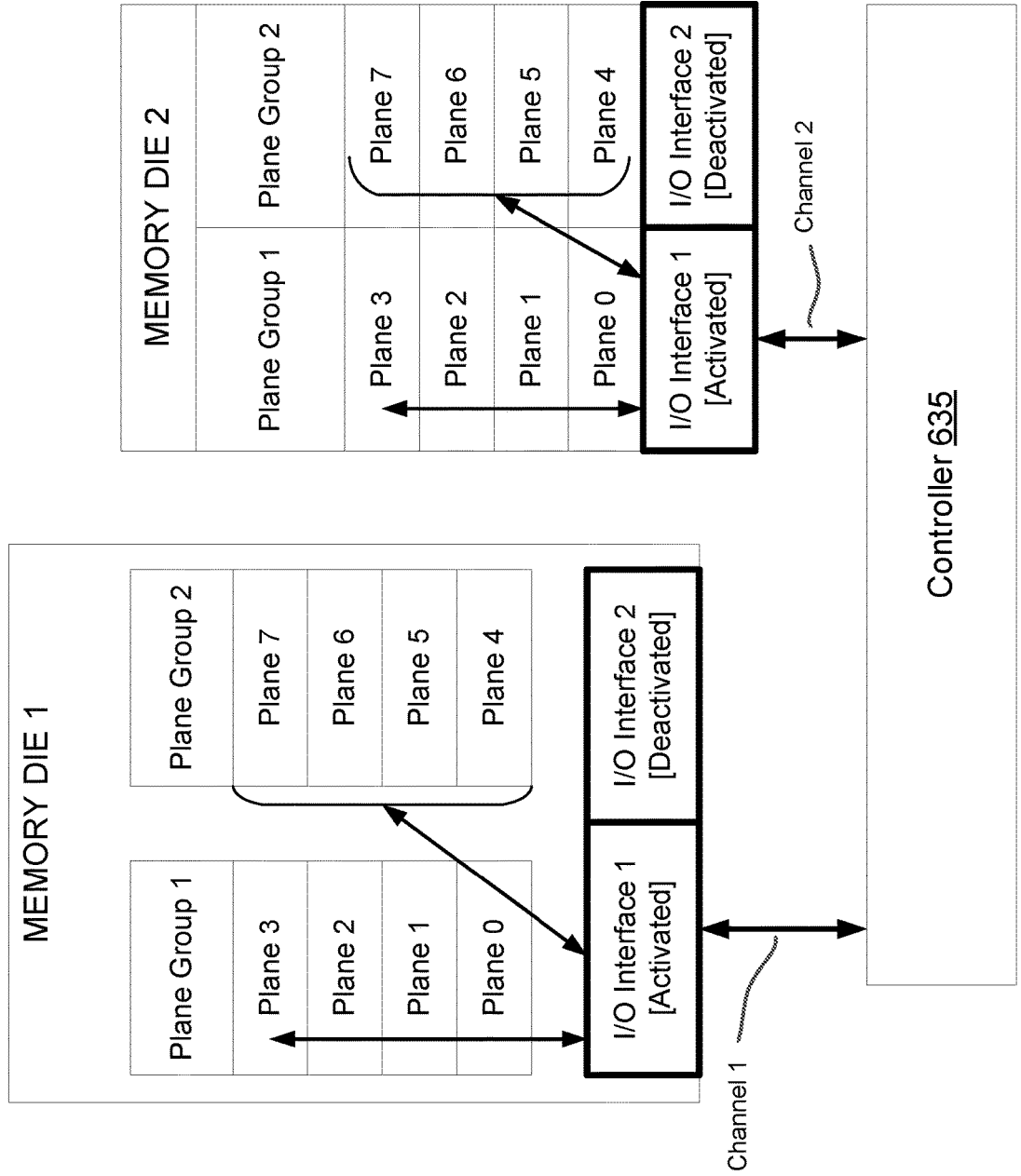
FIG. 6 is a schematic illustration of an example memory sub-system including multiple memory devices (e.g., multiple memory dies) and multiple I/O interfaces configurable to operate in a single-channel mode, in accordance with embodiments of the present disclosure.

FIG. 6 illustrates an embodiment of a memory sub-system (e.g., a high-density memory system including two memory die) configured to operate in the single-channel mode (i.e., a second mode). In the single-channel mode, each memory die (e.g., memory die 1 and memory die 2) are communicatively connected to the controller by a single channel and activated I/O interface. In the example shown, I/O interface 1 is activated and I/O interface 2 is deactivated (e.g., by way of a controller command, a trim command, or via bonding). As shown, I/O interface 1 of memory die 1 and I/O interface 1 of memory die 2 are activated, while the I/O interface 2 of each memory die is deactivated. In an embodiment, communications for memory die 1 are transmitted via channel 1 and communications for memory die 2 are transmitted via channel 2. In this embodiment, the activated I/O interface 1 accesses plane group 1 and plane group 2 of memory die 1. Similarly, in this embodiment, the activated I/O interface 1 of memory die 2 accesses plane group 1 and plane group 2. In an embodiment, controller 635 can configure either of the I/O interfaces to be deactivated or activated using a command (e.g., a controller command or trim command) or via bonding.

Figure 7:
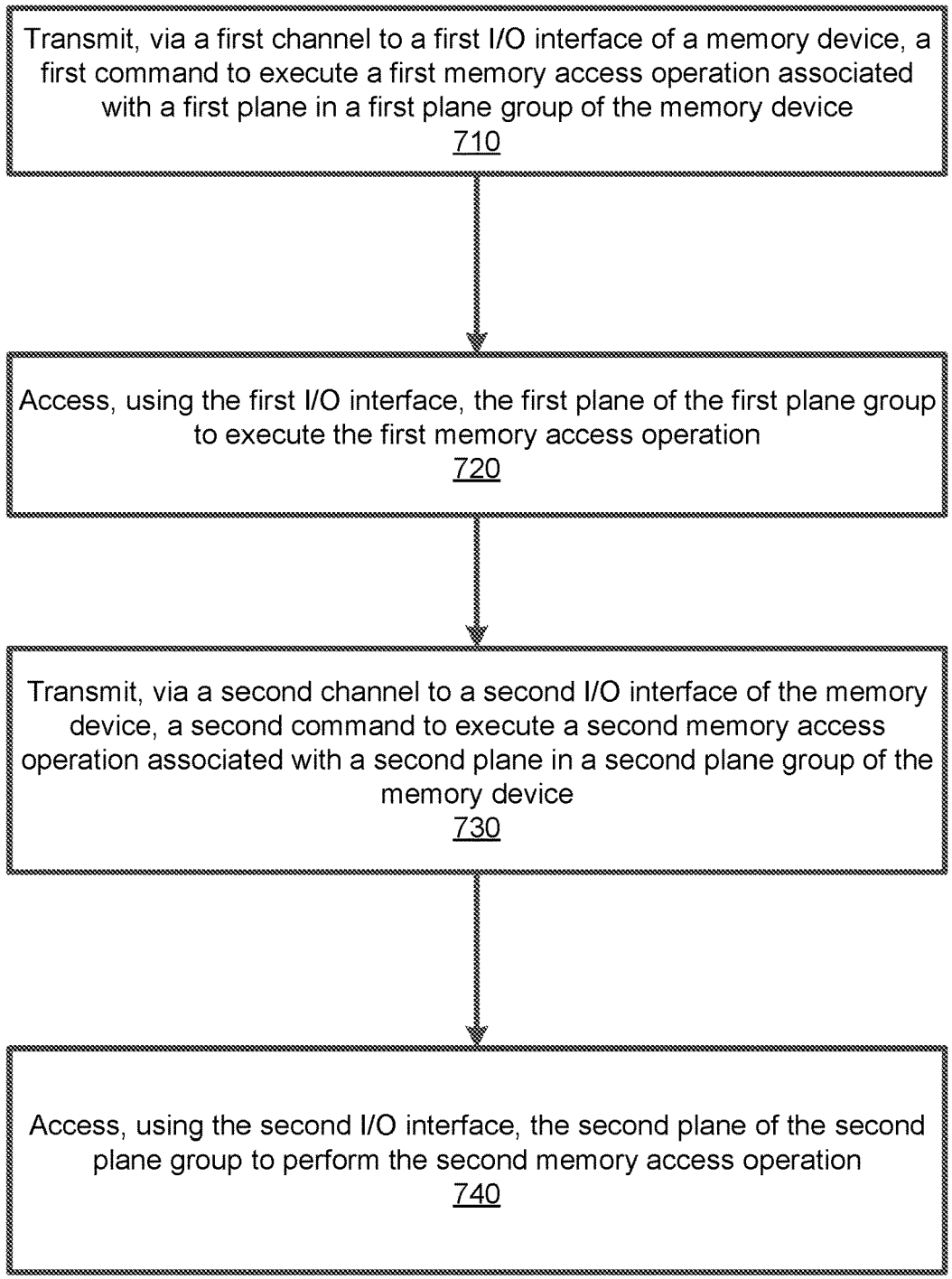
FIG. 7 is a flow diagram of an example method of managing a memory device having multiple I/O interfaces configured to access multiple plane groups of the memory device to perform memory access operations, in accordance with one or more embodiments of the present disclosure.

FIG. 7 is a flow diagram of an example method of performing memory access operations on a memory device having multiple I/O interfaces associated with accessing multiple plane groups of the memory device, in accordance with one or more embodiments of the present disclosure. The method 700 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 700 is performed by the local media controller 135 and multiple I/O interfaces 137 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 710, a command is transmitted. For example, processing logic (e.g., local media controller 135) can transmit, via a first channel to a first I/O interface of a memory device, a first command to execute a first memory access operation associated with a first plane in a first plane group of the memory device. In an embodiment, the memory device has a first plane group including a set of memory planes including the first plane. In an embodiment, the first I/O interface is activated and configured (e.g., in a default configuration) to access the first plane group in association with the execution of memory access operations relating to memory cells of the first plane group. In an embodiment, the first memory access operation can be a read operation, a write operation, or an erase operation associated with one or more memory cells of a memory plane (e.g., the first plane) of the first plane group.

At operation 720, a memory plane is accessed. For example, processing logic can access, using the first I/O interface, the first plane of the first plane group to execute the first memory access operation. In an embodiment, the first I/O interface is configured to access the planes in the first plane group. For example, as shown in FIG. 4, the first plane group can include Plane Group 1 which is accessed (as denoted by the double-arrowed line) using I/O Interface 1 of memory device 430. In this example, the first plane can include plane 0, plane 1, plane 2, or plane 3 of Plane Group 1.

At operation 730, a command is transmitted. For example, processing logic can transmit, via a second channel to a second I/O interface of the memory die, a second command to execute a second memory access operation associated with a second plane in a first plane group of the memory die. In an embodiment, the memory device has a second plane group including a set of memory planes including the second plane (e.g., plane 4, 5, 6, or 7 of Plane Group 2 in FIG. 4). In an embodiment, the second I/O interface is activated and configured (e.g., in a default configuration) to access the second plane group in association with the execution of memory access operations relating to memory cells of the second plane group. In an embodiment, the second memory access operation can be a read operation, a write operation, or an erase operation associated with one or more memory cells of a memory plane (e.g., the second plane) of the second plane group.

At operation 740, a memory plane is accessed. For example, processing logic can access, using the second I/O interface, the second plane of the second plane group to execute the second memory access operation. In an embodiment, the second I/O interface is configured to access the planes in the second plane group. For example, as shown in FIG. 4, the second plane group can include Plane Group 2 which is accessed (as denoted by the double-arrowed line) using I/O Interface 2 of memory die 438. In this example, the second plane can include plane 4, plane 5, plane 6, or plane 7 of Plane Group 2. In an embodiment, the first memory access operation and the second memory access operation can be executed concurrently as a result of the multiple I/O interfaces and associated plane group access.

In an embodiment, the memory device can include a multiplexer circuit. In this embodiment, following completion of the execution of the second memory access operation, a third command to execute a third memory access operation associated with a third plane of the first plane group can be transmitted to the second I/O interface. In an embodiment, although the default configuration of the second I/O interface is to access the second plane group, the multiplexer circuit can enable access by the second I/O interface to the third plane which is part of the first plane group. In this example, as shown in FIG. 5, since first I/O interface is busy executing the first memory access operation, the third command can be transmitted by the processing logic to the second I/O interface and the multiplexer circuit can allow the second I/O interface to access the first plane group to execute the third memory access operation. In an embodiment, the access by the first I/O interface to the first plane group and the access by the second I/O interface to the second plane group can be performed concurrently.

In an embodiment, in response to the satisfaction of a condition, processing logic can switch from the two-channel mode described above to a single-channel mode. In this embodiment, processing logic transitions to the single-channel mode by deactivating one of the first I/O interface or the second I/O interface. For example, processing logic can deactivate the second I/O interface, such that the commands are transmitted via the first channel to the first I/O interface. In this embodiment, the first I/O interface can access the first plane group and the second plane group of the memory device. In an embodiment, the condition can include, for example, operation of the memory device in a low power mode.

Figure 8:
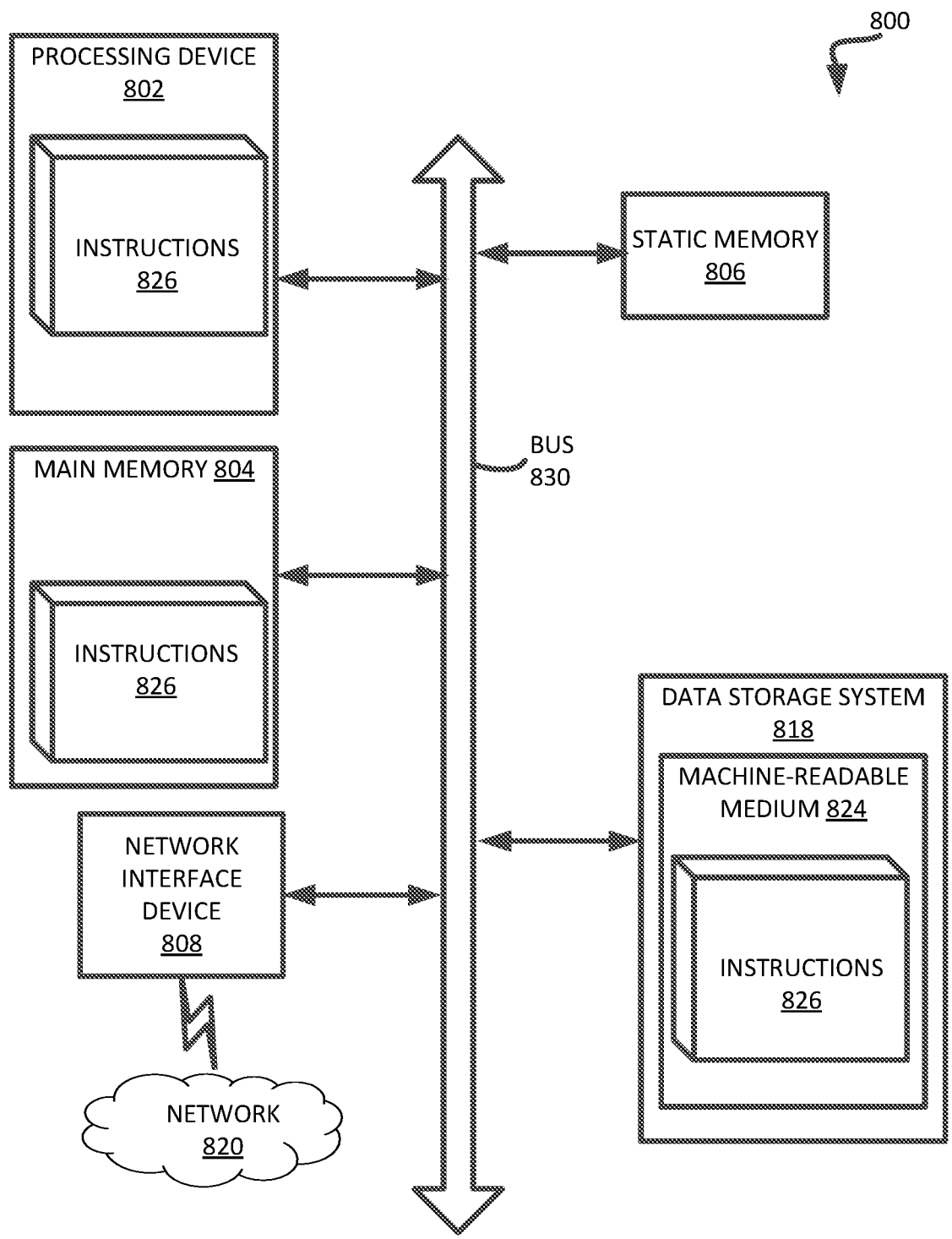
FIG. 8 is a block diagram of an example computer system in which embodiments of the present disclosure can operate.

FIG. 8 illustrates an example machine of a computer system 800 within which a set of instructions, for causing the machine to perform any one or more of the methodologies discussed herein, can be executed. In some embodiments, the computer system 800 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to execute instructions 826 to perform operations corresponding to the two-channel mode and single-channel mode associated with the multiple I/O interfaces 136 managed by an I/O interface mode manager 136 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 800 includes a processing device 802, a main memory 804 (e.g., read-only memory (ROM), flash memory, dynamic random access memory (DRAM) such as synchronous DRAM (SDRAM) or Rambus DRAM (RDRAM), etc.), a static memory 806 (e.g., flash memory, static random access memory (SRAM), etc.), and a data storage system 818, which communicate with each other via a bus 830.

Processing device 802 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 802 can also be one or more special-purpose processing devices such as an application specific integrated circuit (ASIC), a field programmable gate array (FPGA), a digital signal processor (DSP), network processor, or the like. The processing device 802 is configured to execute instructions 826 for performing the operations and steps discussed herein. The computer system 800 can further include a network interface device 808 to communicate over the network 820.

The data storage system 818 can include a machine-readable storage medium 824 (also known as a computer-readable medium, such as a non-transitory computer-readable medium) on which is stored one or more sets of instructions 826 or software embodying any one or more of the methodologies or functions described herein. The instructions 826 can also reside, completely or at least partially, within the main memory 804 and/or within the processing device 802 during execution thereof by the computer system 800, the main memory 804 and the processing device 802 also constituting machine-readable storage media. The machine-readable storage medium 824, data storage system 818, and/or main memory 804 can correspond to the memory sub-system 110 of FIG. 1.

In one embodiment, the instructions 826 include instructions to implement functionality corresponding to the multiple I/O interfaces 137 and I/O interface mode manager 136 of FIG. 1). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A memory device comprising:
 a plurality of plane groups comprising:
  a first plane group comprising a first plane of the memory device; and
  a second plane group comprising a second plane of the memory device;
 a first input/output (I/O) interface configured to access the first plane group;
 a second I/O interface configured to access the second plane group;
 a multiplexer circuit coupled to the first I/O interface and the second I/O interface, the multiplexer circuit to:
  enable the first I/O interface to access the first plane group and the second plane group, and
  enable the second I/O interface to access the first plane group and the second plane group; and
 a controller operatively coupled to the first I/O interface via a first channel and operatively coupled to the second I/O interface via a second channel, the controller to perform operations comprising:
  transmitting, via the first channel to the first I/O interface, a first command to execute a first memory access operation associated with the first plane; and
  transmitting, via the second channel to the second I/O interface, a second command to execute a second memory access operation associated with the second plane, wherein the first memory access operation and the second memory access operation are executed concurrently.

2. The memory device of claim 1, wherein the first I/O interface performs a first access to the first plane of the first plane group to execute the first memory access operation, and wherein the second I/O interface performs a second access to the second plane of the second plane group to execute the second memory access operation.

3. The memory device of claim 2, wherein the first access by the first I/O interface to the first plane group and second access by the second I/O interface to the second plane group are performed concurrently.

4. The memory device of claim 1, wherein the second I/O interface is deactivated by at least one of a third command from the controller, a trim command, or via bonding.

5. The memory device of claim 4, wherein the controller is to perform operations further comprising transmitting, via the first channel to the first I/O interface, a fourth command to execute a third memory access operation associated with a third plane of the second plane group.

6. The memory device of claim 5, wherein the first I/O interface performs a third access to the third plane of the second plane group.

7. The memory device of claim 1, further comprising at least a third plane group and a fourth plane group.

8. The memory device of claim 7, wherein the first I/O interface is activated and the second I/O interface is deactivated, and wherein the controller transmits commands via the second channel to the first I/O interface to access the third plane group and the fourth plane group.

9. A memory sub-system comprising:
 a first memory device comprising a first plane group, a second plane group, a multiplexer circuit, a first I/O interface and a second I/O interface and
 control logic, operatively coupled with the first I/O interface via a first channel and the second I/O interface via a second channel, to perform operations comprising:
  transmitting, via the first channel to the first I/O interface, a first command to execute a first memory access operation associated with the first plane group of the first memory device, wherein the multiplexer circuit enables the first I/O interface to access the first plane group and the second plane group; and
  transmitting, via the second channel to the second I/O interface, a second command to execute a second memory access operation associated with the second plane group of the first memory device, wherein the multiplexer circuit enables the second I/O interface to access the first plane group and the second plane group, and wherein the first memory access operation and the second memory access operation are executed concurrently.

10. The memory sub-system of claim 9, the operations comprising:
 activating the first I/O interface; and
 activating the second I/O interface.

11. The memory sub-system of claim 10, the operations comprising:
deactivating the second I/O interface, wherein the first I/O interface accesses the first plane group and the second plane group to perform one or more memory access operations.

12. The memory sub-system of claim 9, further comprising a second memory device comprising a third plane group and a fourth plane group.

13. The memory sub-system of claim 12, wherein the control logic transmits one or more first commands associated with the first plane group and the second plane group of the first memory device to the first I/O interface via the first channel.

14. The memory sub-system of claim 13, wherein the control logic transmits one or more second commands associated with the third plane group and the fourth plane group of the second memory device to the first I/O interface via the second channel.

15. A memory device comprising:
a first plane group comprising a first set of planes;
a second plane group comprising a second set of planes;
a first I/O interface configured to access the first plane group and the second plane group of the memory device via a multiplexer circuit to transmit a first command to execute a first memory access operation; and
a second I/O interface configured to access the first plane group and the second plane group of the memory device via the multiplexer circuit to transmit a second command to execute a second memory access operation, wherein the first memory access operation and the second memory access operation are executed concurrently.

16. The memory device of claim 15, wherein the memory device is configurable to operate in a first mode wherein the first I/O interface and the second I/O interface are activated.

17. The memory device of claim 16, wherein the memory device is configurable to operate in a second mode wherein one of the first I/O interface or the second I/O interface is deactivated.

18. The memory device of claim 15, wherein the multiplexer circuit enables the first I/O interface to access the second plane group and the second I/O interface to access the first plane group.

19. The memory device of claim 15, wherein the first I/O interface receives, from a controller via a first channel, the first command associated with the first memory access operation to be performed on a first plane of the first plane group, and wherein the second I/O interface receives, from the controller via a second channel, the second command associated with the second memory access operation to be performed on a second plane of the second plane group.

* * * * *